(12) United States Patent
Kwak et al.

(10) Patent No.: US 7,880,384 B2
(45) Date of Patent: Feb. 1, 2011

(54) ORGANIC LIGHT EMITTING DISPLAY DEVICE AND METHOD FOR FABRICATING THE SAME

(75) Inventors: Won Kyu Kwak, Seoul (KR); Hae Jin Chun, Seoul (KR)

(73) Assignee: Samsung Mobile Display Co., Ltd., Yongin (KR)

(*) Notice: Subject to any disclaimer, the term of this patent is extended or adjusted under 35 U.S.C. 154(b) by 493 days.

(21) Appl. No.: 11/782,831

(22) Filed: Jul. 25, 2007

(65) Prior Publication Data

US 2008/0111492 A1 May 15, 2008

(30) Foreign Application Priority Data

Nov. 10, 2006 (KR) .................. 10-2006-0111076

(51) Int. Cl.
*H01J 1/62* (2006.01)
*H01J 63/04* (2006.01)

(52) U.S. Cl. .................. 313/512; 313/504; 315/169.4
(58) Field of Classification Search .................. 313/512, 313/504; 445/25; 315/169.3, 169.4, 160
See application file for complete search history.

(56) References Cited

U.S. PATENT DOCUMENTS

| 6,822,264 | B2* | 11/2004 | Yamazaki et al. | 257/79 |
|---|---|---|---|---|
| 6,917,408 | B2 | 7/2005 | Nishino | |
| 7,291,970 | B2* | 11/2007 | Kuwabara | 313/504 |
| 7,474,375 | B2 | 1/2009 | Kwak et al. | |
| 2002/0005696 | A1* | 1/2002 | Yamazaki et al. | 315/169.3 |
| 2003/0132716 | A1* | 7/2003 | Yamazaki et al. | 315/169.3 |
| 2004/0232459 | A1* | 11/2004 | Takayama et al. | 257/295 |
| 2005/0195148 | A1* | 9/2005 | Iisaka | 345/98 |
| 2005/0195355 | A1* | 9/2005 | Kwak et al. | 349/149 |
| 2005/0280363 | A1* | 12/2005 | Han et al. | 313/506 |
| 2006/0076887 | A1 | 4/2006 | Kang | |
| 2007/0015430 | A1 | 1/2007 | Nishio et al. | |

(Continued)

FOREIGN PATENT DOCUMENTS

CN 1670570 9/2005

(Continued)

OTHER PUBLICATIONS

Notice of Allowance issued in corresponding Korean Patent Application No. 2006-0111076 dated Jan. 31, 2008.

(Continued)

*Primary Examiner*—Nimeshkumar D Patel
*Assistant Examiner*—Glenn Zimmerman
(74) *Attorney, Agent, or Firm*—Stein McEwen, LLP

(57) ABSTRACT

An organic light emitting display device capable of preventing damage to signal and power lines that drive a pixel region, and a method for fabricating the same. The organic light emitting display device includes a device substrate including at least a pixel region; an encapsulation substrate to overlap at least one region of the device substrate including the pixel region; a sealing agent arranged between the device substrate and the encapsulation substrate to seal a region therebetween; at least one wire formed on the device substrate to extend from inside a sealing region to the outside of the sealing region; a first protective layer formed on the wire; and a second protective layer formed on the first protective layer to overlap at least one edge of the encapsulation substrate which is arranged to cross the wire.

27 Claims, 9 Drawing Sheets

U.S. PATENT DOCUMENTS

2007/0075313 A1* 4/2007 Kwak et al. .................. 257/59
2007/0194710 A1* 8/2007 Song et al. .................. 313/512

FOREIGN PATENT DOCUMENTS

| | | |
|---|---|---|
| CN | 1761372 | 4/2006 |
| JP | 2002-031806 | 1/2002 |
| JP | 2003-228300 | 8/2003 |
| JP | 2003-257650 | 9/2003 |
| JP | P3481232 | 10/2003 |
| JP | 2004-191573 | 7/2004 |
| JP | 2005-227313 | 8/2005 |
| JP | 2005-242161 | 9/2005 |
| JP | 2006-080023 | 3/2006 |
| KR | 2006-65369 | 6/2006 |
| KR | 2006-67041 | 6/2006 |
| KR | 2006-118758 | 11/2006 |
| KR | 2006-118760 | 11/2006 |

OTHER PUBLICATIONS

Office Action issued by State Intellectual Property Office in Chinese Patent Application No. 2007101699738 on Jul. 31, 2009.

Office Action issued by Japanese Intellectual Property Office in Japanese Patent Application No. 2007-026586 on Sep. 24, 2009.

Japanese Office Action issued Jan. 19, 2010, in corresponding Japanese Patent Application No. 2007-026586.

* cited by examiner

ORGANIC LIGHT EMITTING DISPLAY DEVICE AND METHOD FOR FABRICATING THE SAME

CROSS-REFERENCE TO RELATED APPLICATIONS

This application claims the benefit of Korean Application No. 2006-111076, filed Nov. 10, 2006, in the Korean Intellectual Property Office, the disclosure of which is incorporated herein by reference.

BACKGROUND OF THE INVENTION

1. Field of the Invention

Aspects of the present invention relate to an organic light emitting display device and a method for fabricating the same, and more particularly to an organic light emitting display device capable of preventing damage of signal lines and power lines for driving a pixel region, and a method for fabricating the same.

2. Description of the Related Art

In recent years, there have been many attempts to develop various flat panel displays that are lighter and smaller than cathode ray tubes. In particular, an organic light emitting display device having excellent luminous efficiency, luminance, viewing angle, and rapid response time has attracted public attention. The organic light emitting display device uses an organic light emitting diode (OLED) as an emissive diode. The organic light emitting diode includes an anode electrode, a cathode electrode, and an organic light emission layer arranged between the anode electrode and the cathode electrode. The organic light emission layer emits light by recombining holes and electrons, supplied from the anode electrode and the cathode electrode, to generate excitons.

FIG. 1 is a perspective view showing a conventional organic light emitting display device.

Referring to FIG. 1, an organic light emitting display (OLED) device 100 includes a device substrate 110 having a pixel region 140 and a scan driver 150 formed therein; an encapsulation substrate 120 arranged on the device substrate 110 to seal at least the pixel region 140; and a data driver 160 installed onto the device substrate 110 outside a sealing region of the encapsulation substrate 120. The sealing region is the region of the OLED device 100 that is disposed between the device substrate 110 and the encapsulation substrate 120 and sealed therein by a sealing agent 130.

The pixel region 140 includes a large number of pixels 145 formed on the device substrate 110. The pixels 145 are arranged regions in which scan lines (S) and data lines (D) cross. And, the pixels 145 are connected to one of the scan lines (S) and the data lines (D), respectively, and include at least an organic light emitting diode. Such pixels 145 generate light having a luminance corresponding to a data signal supplied from the data lines (D) when a scan signal is supplied from the scan lines (S) connected to the pixels 145. Therefore, the pixel region 140 displays an image.

Here, the pixels 145 include an organic light emission layer in which the organic light emitting diode, etc., is disposed. The organic light emission layer may easily deteriorate when oxygen or moisture penetrate therein. Accordingly, the pixel region 140 with the pixels 145 formed therein should be sealed to prevent the penetration of oxygen and moisture.

The scan driver 150 is driven by scan control signals supplied from a device outside the OLED device 100, such as a clock signal, a start pulse, an output enable signal, etc., to generate scan signals. The scan signals generated in the scan driver 150 are supplied to the pixel region 140 through the scan lines (S). If at least one transistor is formed in the pixel region 140, the scan driver 150 is formed on the device substrate 110 together with the transistor, and therefore sealed together with the pixel region 140. However, the scan driver 150 may be installed outside the sealing region in a chip form.

The encapsulation substrate 120 is arranged on the device substrate 110 to be overlapped with the pixel region 140, thereby to seal at least the pixel region 140. At this time, a sealing agent 130, such as epoxy resin, frit and the like, is formed in an edge of the encapsulation substrate 120. And, the device substrate 110 and the encapsulation substrate 120 are fused by the sealing agent 130 to seal a space therebetween. The encapsulation substrate 120 is scribed so a portion of the encapsulation substrate 120 may be removed and the encapsulation substrate 120 does not overlap a region in which a data driver 160 is installed. The data driver 160 may be installed in a chip form.

The data driver 160 generates data signals to correspond to data and control signals supplied from a device, or a data control unit, external to the OLED device 100. The data signal generated in the data driver 160 is supplied to the pixel region 140 through the data lines (D). The data driver 160 is installed onto the device substrate 110 in a region other than the sealing region after a general sealing process. However, the data driver 160 is not limited thereto. The data driver 160 may be formed on the device substrate 110 together with the pixels 140 and arranged inside the sealing region.

In the case of the above-mentioned conventional OLED device 100, at least one region of the data lines (D) is formed outside the sealing region. Thus, the data lines (D) extend across or through the sealing region as the data lines (D) are formed to connect the data driver 160 to the pixels 145 in the pixel region 140.

In order to prevent corrosion of the data lines (D) that extend out of the sealing region, at least one inorganic insulator is generally formed on the data lines (D).

For example, inorganic insulators 230 and 240 are formed on the data lines 220 to prevent moisture from corroding the data lines 220.

FIG. 2 is a cross-sectional view showing a portion of the OLED device 100 taken along a region "A" of FIG. 1. Data lines and their protective layers are shown in FIG. 2, and only the data lines and the protective layers are shown herein to the exclusion of other wires and insulators.

Referring to FIG. 2, the inorganic insulators 230 and 240 are formed on the data lines 220.

The inorganic insulators 230 and 240 are formed of an interlayer insulator 230 and an inorganic planarization layer 240. And, the inorganic insulators 230 and 240 are formed together with the pixel region 140.

Such inorganic insulators 230 and 240 protect the data lines 220. However, the inorganic insulators 230 and 240 are formed to partially overlap the sealing agent 130 such that the sealing agent 130 is disposed on the surface of the inorganic insulators 230 and 240. And the inorganic insulators 230 and 240 are formed of only inorganic materials as oxygen and moisture may penetrate the sealing region via the organic materials if the organic materials are included in the inorganic insulators 230 and 240.

However, the inorganic insulators 230 and 240 formed only in the pixel region cannot sufficiently protect the data lines 220 that extend from the pixel region to the data driver 160 from the penetration of oxygen and moisture.

Further, the inorganic insulators 230 and 240 formed on the data lines 220may not effectively protect the data lines 220 when the encapsulation substrate 120 is scribed.

More particularly, the inorganic insulators 230 and 240 may be easily broken by external impacts inflicted during a process for scribing and separating the encapsulation substrate 120. When the inorganic insulators 230 and 240 are broken during scribing and separating of the encapsulation substrate 120, the data lines 220 may be corroded as moisture penetrates cracks in the broken inorganic insulators 230 and 240. As a result, some of the data lines 220 are opened, resulting in poor emission of light from and display of images on the OLED device 100. Reliability testing, carried out at high temperatures and moisture contents, exposes weaknesses of the inorganic insulators 230 and 240.

In addition to damage to the data lines 220, power lines supply power from sources outside of the pixel region 140 to the pixel region 140 and the scan driver 150 may be damaged due to inadequate protection; and signal lines to supply scan control signals from a source, or scan control unit, outside of the pixel region 140 to the scan driver 150 disposed in the pixel region 140 may be damaged as the signal lines may be arranged beneath the scribing line of the encapsulation substrate 120.

FIG. 3A to FIG. 3D are diagrams showing a method for fabricating the organic light emitting display device as shown in FIG. 1.

Referring to FIG. 3A to FIG. 3D, to fabricate the organic light emitting display (OLED) device 100 as shown in FIG. 1, the pixels 145, the scan lines (S), the data lines (D), and the scan driver 150 are formed first on the device substrate 110 (FIG. 3A).

Then, the encapsulation substrate 120, coated with the sealing agent 130, is arranged on the device substrate 110, and then a sealing process is performed. The sealing agent 130 is disposed along an inside edge of the scribing line 310 of the encapsulation substrate 120 so that the sealing agent 130 seals the encapsulation substrate 120 about the pixel region 140. The sealing agent 130 is formed to seal at least the pixel region 140 (FIG. 3B).

Then, a process for scribing the encapsulation substrate 120 is carried out along the scribing line 310, and a removal region (120-1) is separated (FIG. 3C) leaving behind the portion of the encapsulation substrate 120 that covers the sealing region.

Then, a data driver 160 is installed on the exposed device substrate 110 outside of the sealing region and is connected to ends of the data lines (D) (FIG. 3D).

In the fabricating process of the above-mentioned OLED device 100, the inorganic insulators 230 and 240 may be broken as the inorganic insulators 230 and 240 on the data lines 220 collide with the removal region (120-1) when the removal region (120-1) of the encapsulation substrate 120 is separated as shown in FIG. 3C. The inorganic insulators 230 and 240 do not effectively protect signal lines and power lines such as the data lines 240 and the like from such impact, resulting in some of the signal lines or the power lines such as the data lines 240 and the like being exposed during the reliability testing at high temperatures and moisture.

SUMMARY OF THE INVENTION

Accordingly, aspects of the present invention are designed to solve such drawbacks and/or others of the prior art, and therefore an aspect of the present invention provides an organic light emitting display device capable of preventing damage of the signal lines and the power lines, as well as of preventing oxygen and moisture from being penetrated into a sealing region, and a method for fabricating the same.

One aspect of the present invention is achieved by providing an organic light emitting display device including a device substrate including at least a pixel region; an encapsulation substrate arranged to overlap at least one region of the device substrate including the pixel region; a sealing agent arranged between the device substrate and the encapsulation substrate to seal a region between the device substrate and the encapsulation substrate; at least one wire formed on the device substrate so that a first end of the at least one wire is arranged inside a sealing region which is sealed by the sealing agent and a second end of the at least one wire is arranged outside of the sealing region; a first protective layer formed on the wire; and a second protective layer formed on the first protective layer to overlap one edge of the encapsulation substrate which is arranged to cross the at least one wire.

The first protective layer is formed of at least one inorganic layer, and the second protective layer is formed of at least one organic layer. The first protective layer is formed of at least one inorganic insulator selected from the group consisting of insulators disposed in the pixel region. The first protective layer is formed of at least one layer selected from the group consisting of an interlayer insulator layer of the pixel region and an inorganic planarization layer of the pixel region. The second protective layer is formed of at least one organic insulator selected from the group consisting of insulators disposed in the pixel region. The second protective layer is formed of same materials as at least one structure selected from the group consisting of an organic planarization layer, a pixel definition layer and spacers disposed between pixels of the pixel region. The second protective layer is formed with a laminated structure of at least two insulators selected from the group consisting of an organic planarization layer, a pixel definition layer and spacers disposed between pixels of the pixel region. The second protective layer includes at least one material selected from the group consisting of acryl and polyimide. The second protective layer is formed to not overlap the sealing agent. The second protective layer is set to a lower height than, or the same height as that of the sealing agent. The second protective layer is formed within a range of 300 μm from the at least one edge of the encapsulation substrate. A data driver for supplying data signals to the pixel region is installed on the device substrate outside the sealing region, and the at least one wire is a plurality of data lines formed between the pixel region and the data driver. The at least one wire is a plurality of data lines. The second protective layer is formed between the sealing agent and the data driver. And, the second protective layer is formed with a laminated structure of at least two organic insulators, wherein at least one of the organic insulators in the second protective layer is formed in a region that crosses the at least one wire but the at least one of the at least one of the organic insulators does not to overlap the at least one wire.

Another aspect of the present invention is achieved by providing a method for fabricating an organic light emitting display device, the method including operations of forming data lines on a device substrate in which a pixel region is defined; forming a first protective layer of at least one inorganic insulator to cover the data lines; forming a second protective layer on the first protective layer to cross the data lines; sealing at least one region on the device substrate including the pixel region with an encapsulation substrate; and scribing the encapsulation substrate in an area corresponding to the second protective layer.

The second protective layer is formed to include at least one organic insulator. The method according to aspects of the present invention further includes an operation of forming pixels on the pixel region. The first protective layer is formed together with the pixels in the operation of forming the pixels, and the first protective layer is formed of at least one material selected from the group consisting of inorganic insulator materials formed in the pixel region. The second protective layer is formed together with the pixels in the operation of forming the pixels, and the second protective layer is formed of at least one material selected from the group consisting of organic insulator materials disposed in the pixel region. The second protective layer is formed with a laminated structure of at least one insulator material selected from the group consisting of an organic planarization layer, a pixel definition layer, and an organic spacer of the pixel region in a process for forming the insulator material of the pixel region. In the process for sealing at least one region on the device substrate, a region between the device substrate and the encapsulation substrate is sealed using a sealing agent applied along an edge of a region inside the scribing line of the encapsulation substrate. The sealing agent is formed on the first protective layer to overlap the first protective layer. The second protective layer is formed outside the sealing region sealed by the sealing agent to not overlap the sealing agent. The second protective layer is formed in a scribing tolerance zone of the encapsulation substrate. The scribing tolerance zone is a region within a range of 300 μm from the scribing line of the encapsulation substrate. The second protective layer is formed to a lower height than, or the same height as that of the sealing agent. And, the second protective layer is formed by laminating at least two organic insulators, and at least one of the organic insulators in the second protective layer is formed in a region between the data lines not to be overlapped with the data lines.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
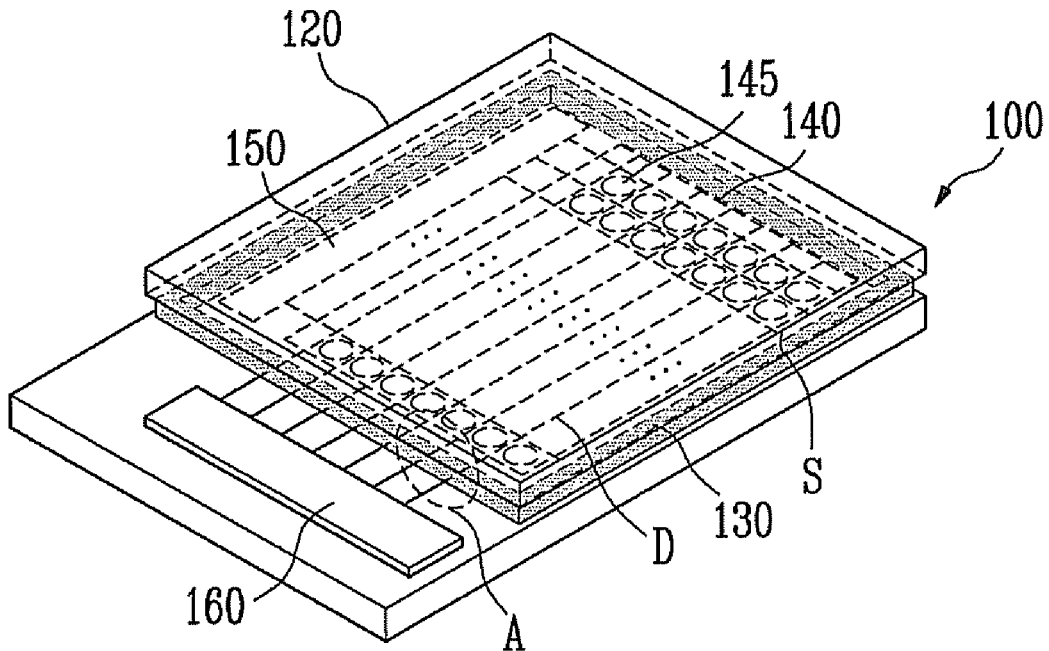
FIG. 1 is a perspective view showing a conventional organic light emitting display device.
Figure 2:
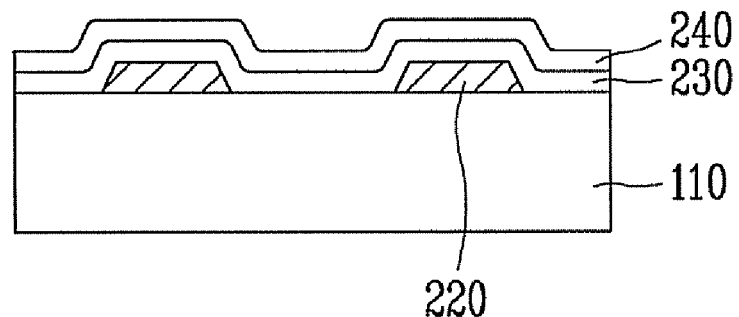
FIG. 2 is a cross-sectional view showing the main part taken along a region "A" of FIG. 1.
Figure 3A:
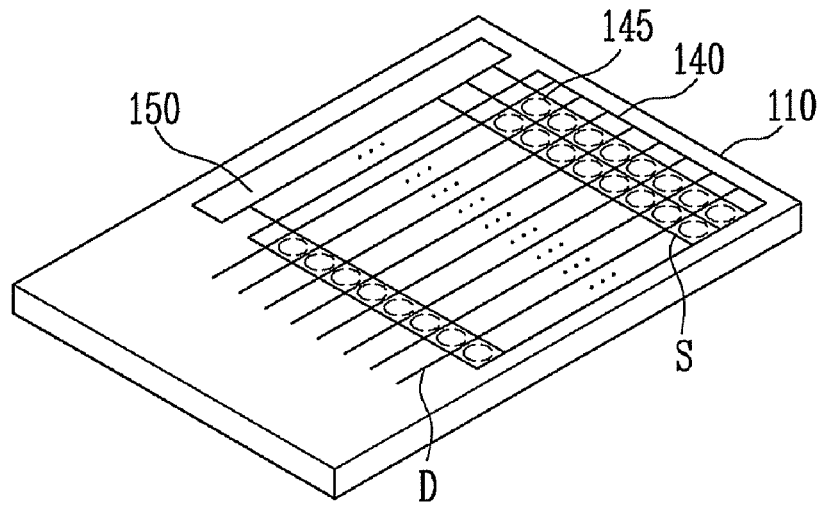
FIG. 3A to FIG. 3D are diagrams showing a method for fabricating the organic light emitting display device as shown in FIG. 1.
Figure 3B:
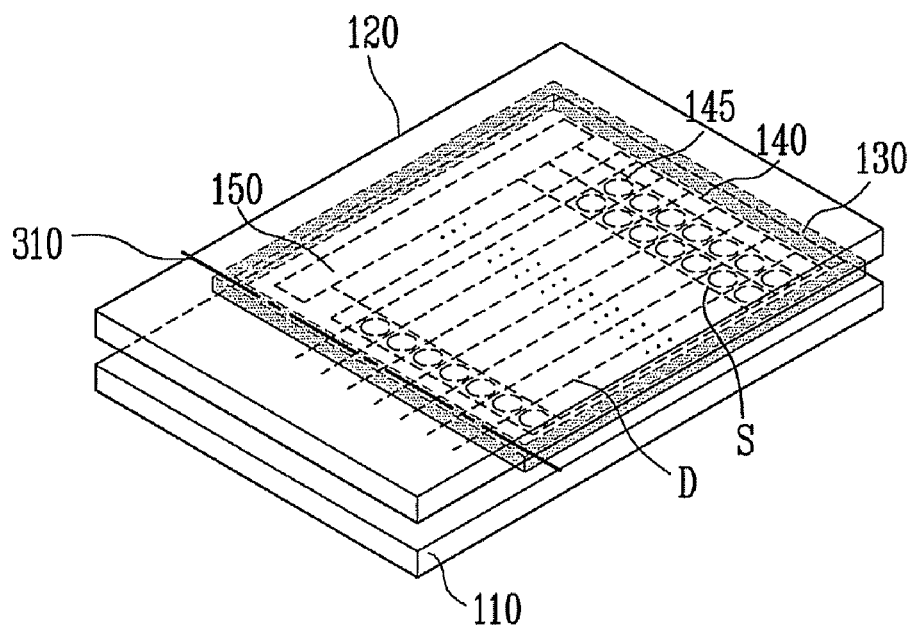
Figure 3C:
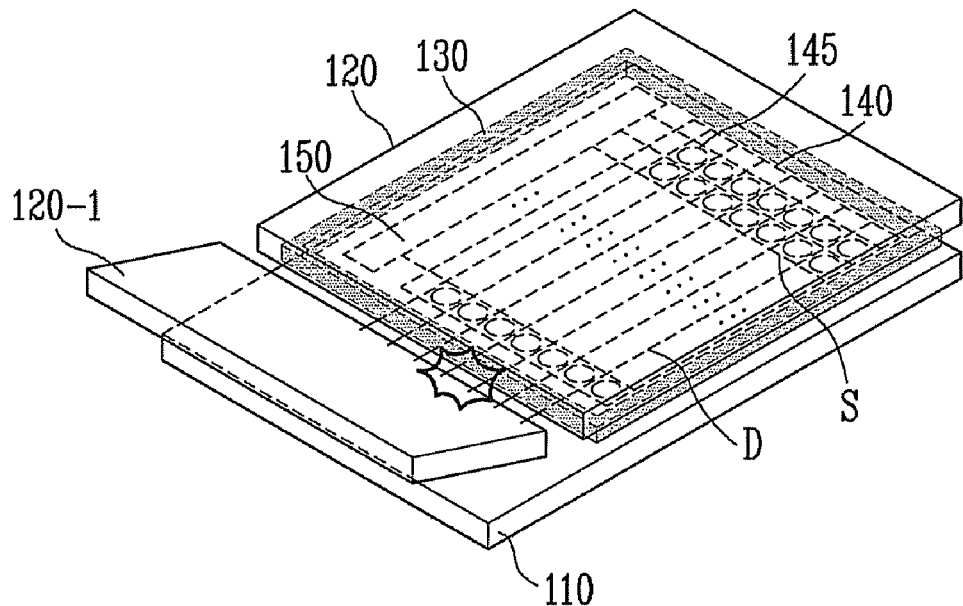
Figure 3D:
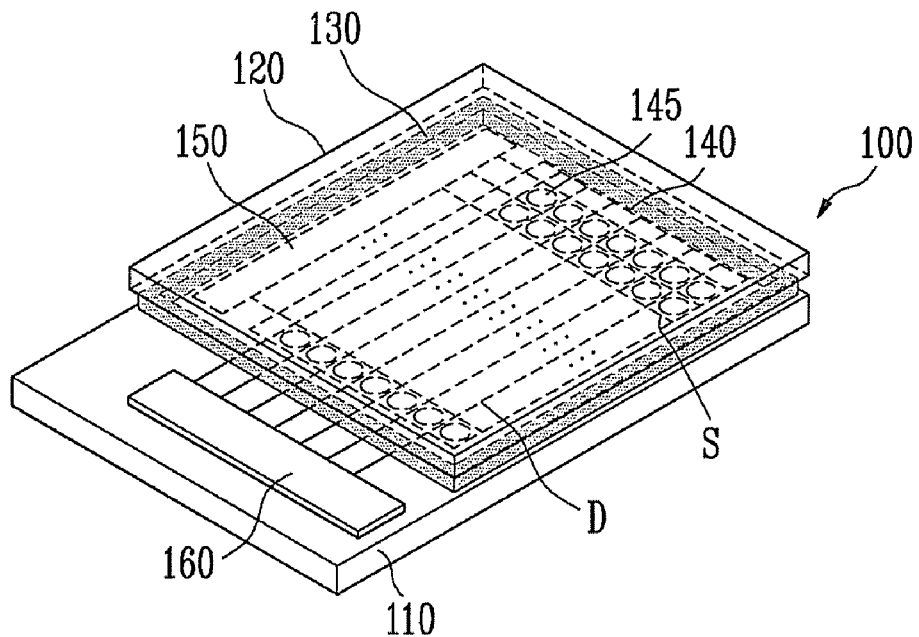

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Hereinafter, aspects of the present invention will be described in detail with reference to the accompanying FIGS. 4 to 10, the aspects of the invention being easily effected by those skilled in the art to which the present invention pertains.

Figure 4:
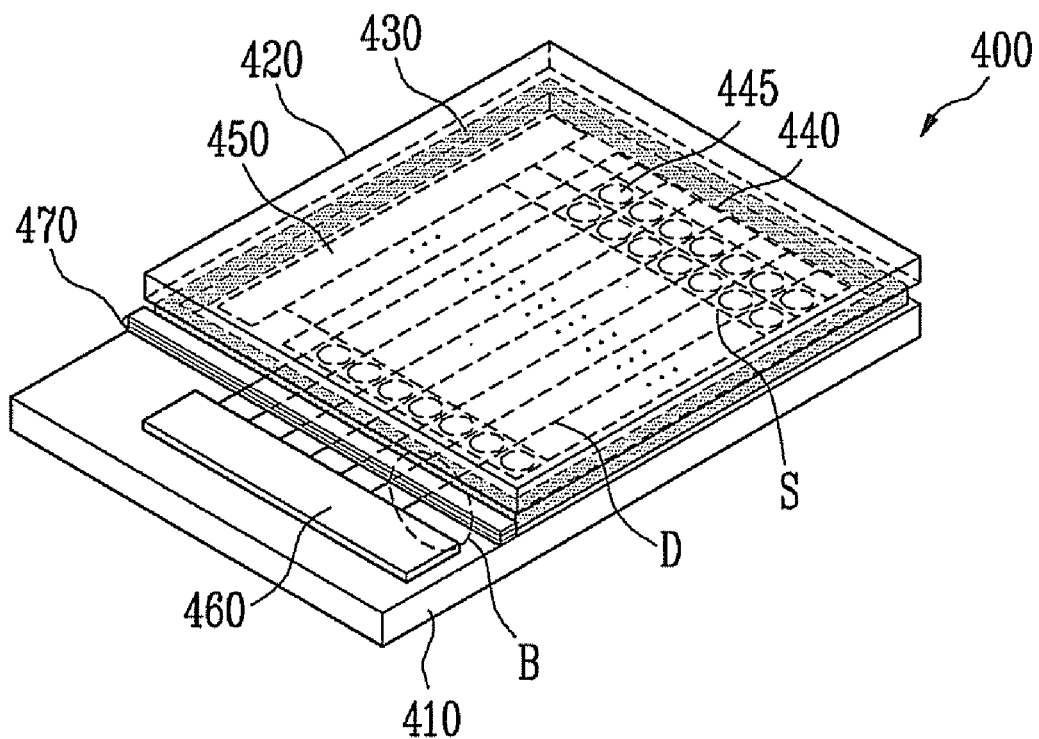
FIG. 4 is a perspective view showing an organic light emitting display device according to aspects of the present invention.
Figure 5:
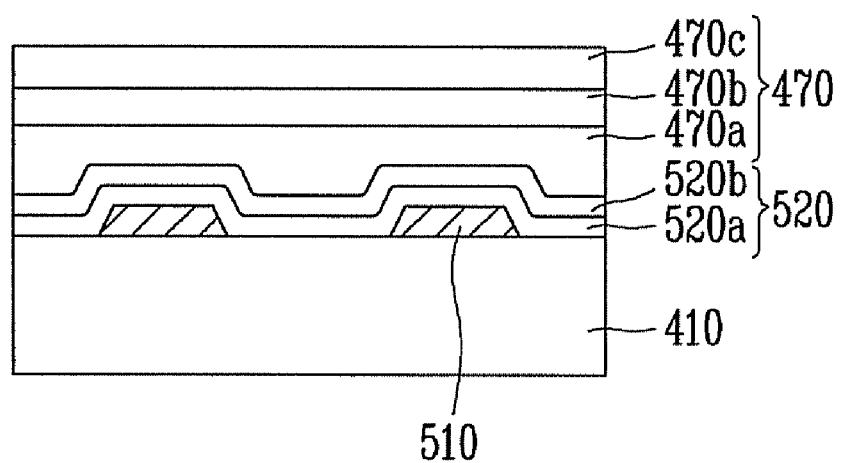
FIG. 5 is a cross-sectional view showing the main part taken along a region "B" of FIG. 4.

FIG. 4 is a perspective view showing an organic light emitting display device according to aspects of the present invention. And, FIG. 5 is a cross-sectional view showing a portion taken along a region "B" of FIG. 4. Data lines and their protective layers are shown in FIG. 5, and wires or insulators except for the data lines and the protective layers are not shown herein.

Referring to FIG. 4 and FIG. 5, the organic light emitting display (OLED) device 400 includes a device substrate 410 having at least a pixel region 440 formed thereon; an encapsulation substrate 420 arranged to overlap at least one region of the device substrate 410 including the pixel region 440. A sealing agent 430 is arranged between the device substrate 410 and the encapsulation substrate 420 to seal a region between the device substrate 410 and the encapsulation substrate 420. The sealing region is the region of the OLED device 400 that is disposed between the device substrate 410 and the encapsulation substrate 420 and sealed therein by a sealing agent 430. The sealing agent 430 is arranged about the periphery of the pixel region 440. Wires 510, such as data lines (D), are formed on the device substrate 410 spanning from a pixel region 440 inside the sealing region to a data driver 460 outside the sealing region. The wires 510 (D) cross a border between the sealing region and the pixel region 440 where the encapsulation substrate 420 ceases to overlap the device substrate 410. A first protective layer 520 is formed on the device substrate 410 to cover the wires 510; and a second protective layer 470 is formed on the first protective layer 520. The second protective layer 470 does not entirely cover the first protective layer 520. The second protective layer 470 extends in a direction to cross the wires 510 (D) and extends in another direction along a border between where the encapsulation substrate 420 overlaps the device substrate 410 and where the encapsulation substrate 420 does not overlap the device substrate. Or, the second protective layer 470 overlaps one side edge of the encapsulation substrate 420 which is arranged to cross the wires 510 (D).

More particularly, a pixel region 440 including a large number of pixels 445 and a scan driver 450 to supply scan signals to the scan lines (S) are formed in the device substrate 410. The pixels 445 are arranged in a region in which the scan lines (S) and the data lines (D) cross. And, a data driver 460 to supply data signals to the data lines (D) is also installed in the device substrate 410.

Each of the pixels 445 includes an organic light emitting diode which generates light corresponding to an electric current supplied to the pixels 445. When the scan signal is supplied to the scan lines (S), the pixels 445 generate light having a luminance corresponding to the data signal supplied from the data line (D). The pixels 445 receive signals from both the scan lines (S) and the data lines (D) connected to the pixels 445. As a result, the pixel region 440 displays an image.

However, the pixels 445 easily deteriorate in the presence of oxygen and moisture, which can penetrate into the organic light emitting diode as the organic light emitting diode includes an organic light emission layer, etc. In order to prevent the penetration of oxygen and moisture, the pixel region 440, having the pixels 445 formed therein, is generally sealed by the encapsulation substrate 420 and the sealing agent 430. That is to say, the pixel region 440 is arranged inside the sealing region between the device substrate 410 and the encapsulation substrate 420.

The scan driver 450 is driven by scan control signals, which include a clock signal, a start pulse, an output enable signal, etc. The scan control signals are supplied to the scan driver 450 from outside of the OLED device 400 through a pad unit or scan control unit (not shown). The scan driver 450 generates scan signals from the scan control signals supplied thereto. The scan signals generated in the scan driver 450 are supplied to the pixels 445 in the pixel region 440 through the scan lines (S). When transistors are formed in the pixel region 440, the scan driver 450 is formed on the device substrate 410 together with the transistors and sealed with the pixel region 440 within the sealing region, or the scan driver 450 may be installed outside the sealing region in a chip form.

The data driver 460 generates data signals and is driven by data and data driving/controlling signals supplied from outside the OLED device 400 through the pad unit, including a data control unit (not shown). The data signal generated in the data driver 460 is supplied to the pixels 445 in the pixel region 440 through the data lines (D). Such a data driver 460 may be generally installed onto the device substrate 410 outside the sealing region in a chip form, or formed on the device substrate 410 together with the pixel region 440 and arranged inside the sealing region.

The encapsulation substrate 420 is arranged to overlap one region of the device substrate 410 that includes at least the pixel region 440. And the encapsulation substrate 420 together with the sealing agent 430 seals the pixel region 440, etc. The encapsulation substrate 420 is scribed not to overlap a region in which the data driver 460 will be installed if the data driver 460 is installed in a chip form. The encapsulation substrate 420 is scribed meaning that a scribing line 610 (in FIG. 6C) is formed in the surface of the encapsulation substrate 420 and a removal region 420-1 (in FIG. 6C) is broken from the encapsulation substrate 420 and removed.

The sealing agent 430 is applied to a surface of the encapsulation substrate 420 facing the device substrate 410 to coalesce or fuse the device substrate 410 to the encapsulation substrate 420 and to prevent oxygen and moisture from penetrating into the sealing region. Therefore, the pixel region 440 is protected. Here, epoxy resin, frit, or the like may be used as the sealing agent 430.

In the OLED device 400, the wires 510 are formed on the device substrate 410 and extend from the inside of the sealing region to the outside of the sealing region. That is to say, the wires 510 are formed on the device substrate 410 so that ends of the wires 510 are arranged inside the sealing region, which is sealed by the sealing agent 430, and the other ends of the wires 510 are arranged outside the sealing region.

In particular, if the data driver 460 is installed outside the sealing region in a chip form, then the data lines (D) formed between the pixel region 440 and the data driver 460 extend from the inside of the sealing region to the outside of the sealing region.

Also, power lines and/or signal lines are formed between supply units (not shown), such as power sources and/or scan controllers, and the pixel region 440 and the scan driver 450. There may be only one power line and only one signal line but aspects of the invention are not limited thereto. As the pixel region 440 and the scan driver 450 are arranged inside the sealing region, the power lines and/or signal lines extend from outside the sealing region to inside the sealing region to connect the power sources and/or scan controllers to the pixel region 440 and the scan driver 450. Accordingly, the power lines and/or signal control lines of the pixel region 440 and the scan driver 450 may be treated as or similarly to the wires 510. Hereinafter, the wires 510 are the data line (D) but aspects of the invention drawn to the wires 510 may also be drawn to the power lines and the control signal lines.

As the wires 510, such as the data lines (D), are generally formed of conductive material such as metal, etc., the wires 510 are corroded when moisture penetrates into the OLED device 400 to the wire 510. If a disconnection is caused by such corrosion, the OLED device 400 produces poor quality display images.

In order to prevent such corrosion, an inorganic protective layer that prevents the penetration of moisture and the like is formed on the data lines 510 (D). And, the inorganic protective layer may be formed of the same insulators as formed in the pixel region 440. For example, the insulator materials may be an interlayer insulator and/or an inorganic planarization layer.

A first protective layer 520 may be formed on the data lines 510 (D), wherein the first protective layer 520 has a laminated structure of a first inorganic insulator 520a and a second inorganic insulator 520b. The first inorganic insulator 520a is formed of an oxide film such as $SiO_2$ and/or a nitride film such as $SiN_x$ which results in the first inorganic insulator 520s being an interlayer insulator formed of the same interlayer insulator as formed in the pixel region 440. And, the second inorganic insulator 520b is formed of a nitride film such as $SiN_x$, etc., which is a material composed of the same inorganic planarization layer formed in the pixel region 440. That is to say, the first protective layer 520 is formed of the inorganic materials and arranged to cover the data lines 510 (D), and therefore the first protective layer 520 serves to prevent moisture, etc., from penetrating to the data lines 510 (D). Here, the first protective layer 520 may be arranged to overlap the sealing agent 430 since it is formed of the inorganic materials capable of preventing the penetration of moisture, etc. Or, the first protective layer 520 is disposed between the device substrate 410 and the sealing agent 430 as the first protective layer 520 is formed of inorganic materials that prevent penetration of moisture to the wires 510 (D) and the sealing region.

However, the first protective layer 520 may be easily broken during the separation process to remove the scribing region 420-1, which occurs after a scribing process of the encapsulation substrate 420. The inorganic layers are brittle such that the inorganic layers are easily broken by external impacts. As such, moisture may penetrate into cracks of the broken first protective layer 520 and corrode the data lines 510 (D).

In order to prevent the first protective layer 520 from being broken, a second protective layer 470, composed of an organic material, is formed on the first protective layer 520.

The second protective layer 470 is formed on the first protective layer 520 to overlap one side edge of the encapsulation substrate 420, the side edge of the encapsulation substrate 420 that crosses the data lines 510 (D). The second protective layer 470 is not limited thereto and may be formed to cover other wires such as power lines or signal lines as described above. The second protective layer 470 is disposed on the first protective layer 520 to overlap any scribing line 610 (of FIG. 6C) that may be formed in the encapsulation substrate 420.

Such a second protective layer 470 prevents direct collision between the removal region 420-1 of the encapsulation substrate 420 that is separated therefrom and the first protective layer 520 in the separation process. The separation process is carried out after scribing the encapsulation substrate 420. Also, the second protective layer 470 absorbs energy from impacts caused by collisions so as to prevent the first protective layer 520 from being broken. The second protective layer 470 is formed of an organic material having flexible and energy absorbing properties. For this purpose, the second protective layer 470 is formed in a scribing tolerance zone of the encapsulation substrate 420.

Since the second protective layer 470 is disposed in the scribing tolerance zone of the encapsulation substrate 420, the second protective layer 470 is arranged to be overlapped with one side edge of the encapsulation substrate 420 after the scribing process. And the second protective layer 470 is arranged within a range of 300 μm from the one side edge of the encapsulation substrate 420 that overlaps the second protective layer 470. So, the second protective layer is partially disposed between the encapsulation substrate 420 and the device substrate 410 after the scribing region 420-1 is removed. Also, the width of the second protective layer 470 and the scribing tolerance zone is less than or about 600 μm-about 300 μm disposed on each side of the edge of the encapsulation substrate 420.

However, the second protective layer 470 is arranged outside of the sealing region and outside of the sealing agent 430 as the second protective layer 470 is composed of an organic material capable of being penetrated by moisture, etc. That is to say, the second protective layer 470 is formed to cross the data lines 510 (D) in a region between the sealing agent 430 and the data driver 460. Also, the second protective layer 470 is formed to a lower height than or the same height as the sealing agent 430 since the sealing region may be poorly sealed if the second protective layer 470 is formed to a higher height than that of the sealing agent 430.

The second protective layer 470 is formed with a thickness of at least 1 μm to effectively protect the first protective layer 520. And, the second protective layer 470 is formed of the same materials as at least one of an organic planarization layer, an organic pixel definition layer, and/or an organic spacer between the pixels 445 in the pixel region 440.

For example, the second protective layer 470 may be formed having a laminated structure of a first organic insulator 470a and a second organic insulator 470b. The first organic insulator 470a is formed of organic planarization layer materials such as acryl, etc. And, the second organic insulator 470b is formed of pixel definition layer materials such as polyimide, etc. Also, if a spacer composed of the organic insulator materials is formed inside the pixel region 440, then the second protective layer 470 may further include a third organic insulator 470c formed of the organic spacer materials of the pixel region 440 and arranged on the second organic insulator 470b. Also, the second protective layer 470 may be formed with a single-layered structure formed of one of the materials of the organic spacers between the pixels 445, the organic pixel definition layer, and/or the organic planarization layer. Or, the second protective layer 470 may be formed of the other materials.

As described above, the organic light emitting display (OLED) device 400 according to aspects of the present invention may prevent the corrosion of the data lines 510 (D) by forming a first protective layer 520 on the data lines 510 (D) that extend from the pixel region 440 inside the sealing region to the data driver 460 outside the sealing region, and the first protective layer 520 is composed of at least one inorganic insulator. Therefore, the poor organic light emitting display quality may be prevented by preventing the data lines 510 (D) from corroding and disconnecting.

Also, the first protective layer 520 may be prevented from being broken by external impacts by forming thereon the second protective layer 470, composed of at least one organic insulator. When the second protective layer 470 is disposed to protect the first protective layer 520, the first protective layer 520 is able to properly protect the wires 510 from moisture. That is to say, the formation of the second protective layer 470 more effectively protects the data lines 510 (D) and prevents damage of the data lines 510 (D) caused by the removal of the scribing region 420-1. Thus, the manufacture of poor OLED devices 400 may be prevented.

Also, the second protective layer 470, which is an organic layer, is arranged outside the sealing region and outside of the sealing agent 430 and does not overlap the sealing agent 430. The second protective layer 470 is also set to a lower height than or the same height as the sealing agent 430 so as to effectively carry out the sealing process. Accordingly, oxygen and moisture are prevented from penetrating into the sealing region.

Meanwhile, power lines and/or control signal lines (not shown) of the pixel region 440 and the scan driver 450 may be protected by forming first and second protective layers 520 and 470, respectively, on the power lines and/or control signal lines of the pixel region 440 formed from the inside of the sealing region to the outside of the sealing region.

Also, although it is shown in FIG. 4 and FIG. 5 that the data driver 460 is installed outside the sealing region, the data driver 460 is not limited thereto. If the data driver 460 is formed inside the sealing region, the power lines and/or signal lines of the data driver 460 may be protected by forming the first and second protective layers 520 and 470, respectively, thereon in the same manner as the first and second protective layers 520 and 470 are formed on the data lines 510 (D) as described above.

FIGS. 6A to 6E are diagrams showing a method for fabricating the organic light emitting display device as shown in FIG. 4. And, FIG. 7 is a cross-sectional view taken along a line C-C' of FIG. 6D. At least one transistor is included in each of the pixels 445 in FIG. 6A to FIG. 7, but the aspects of the present invention are not limited thereto.

Figure 6A:
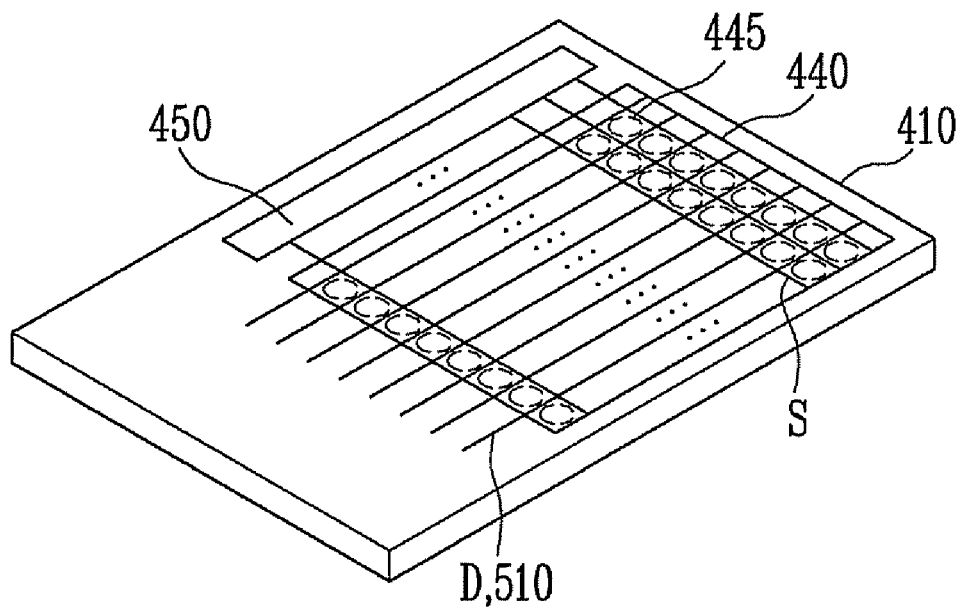
FIG. 6A to FIG. 6E are diagrams showing a method for fabricating the organic light emitting display device as shown in FIG. 4.
Figure 6B:
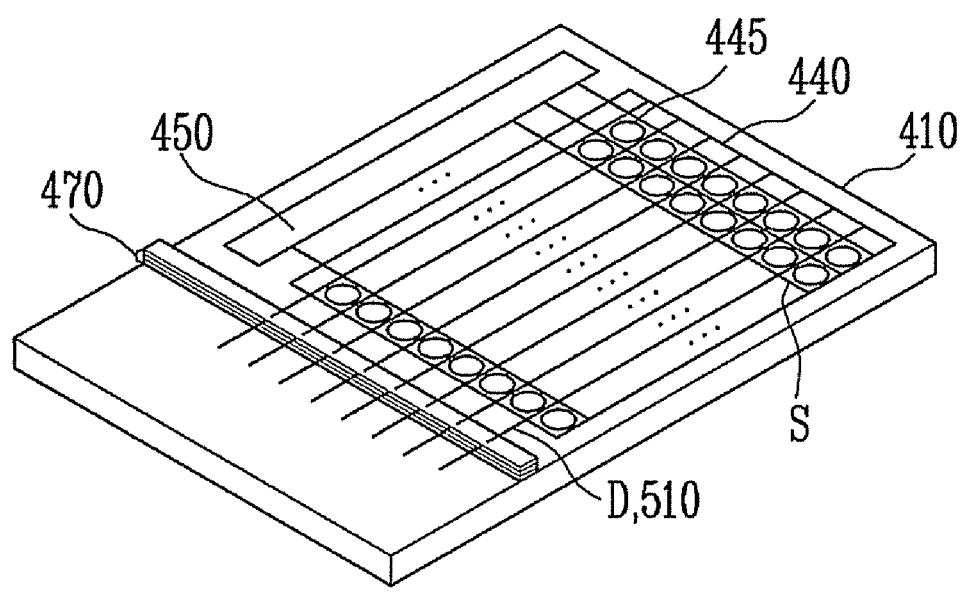
Figure 6C:
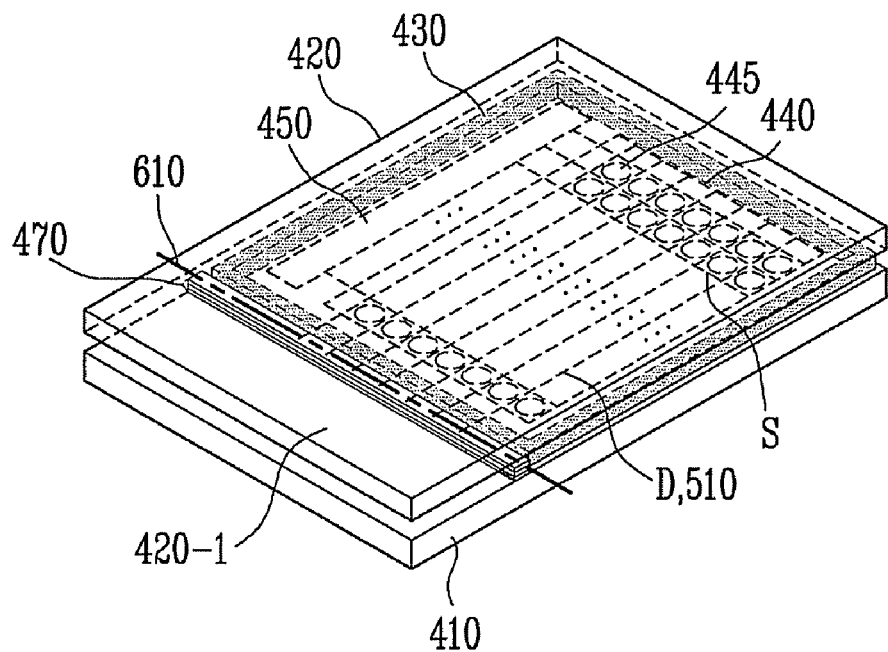
Figure 6D:
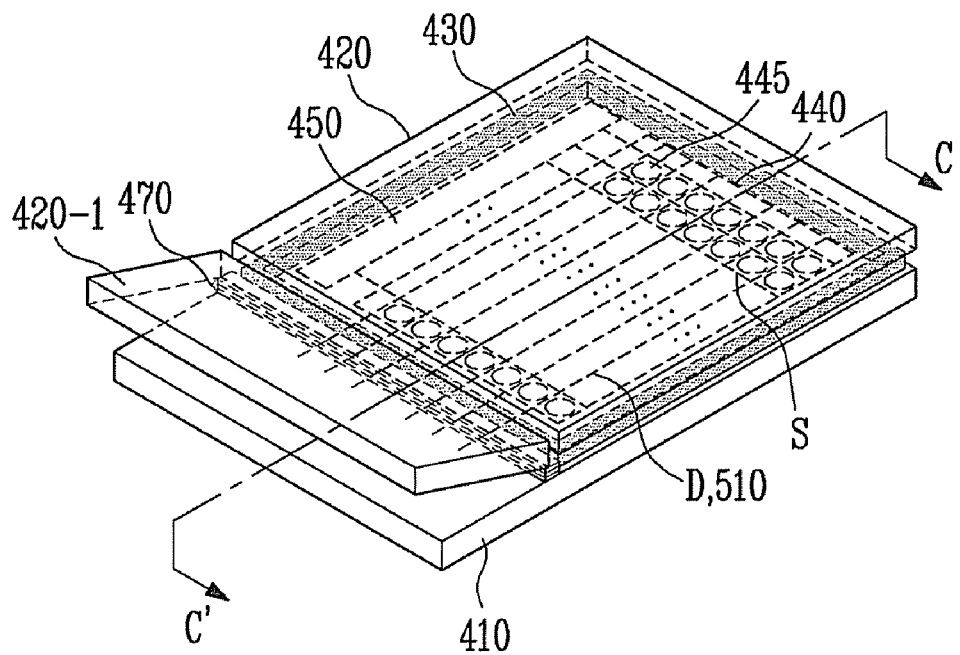
Figure 6E:
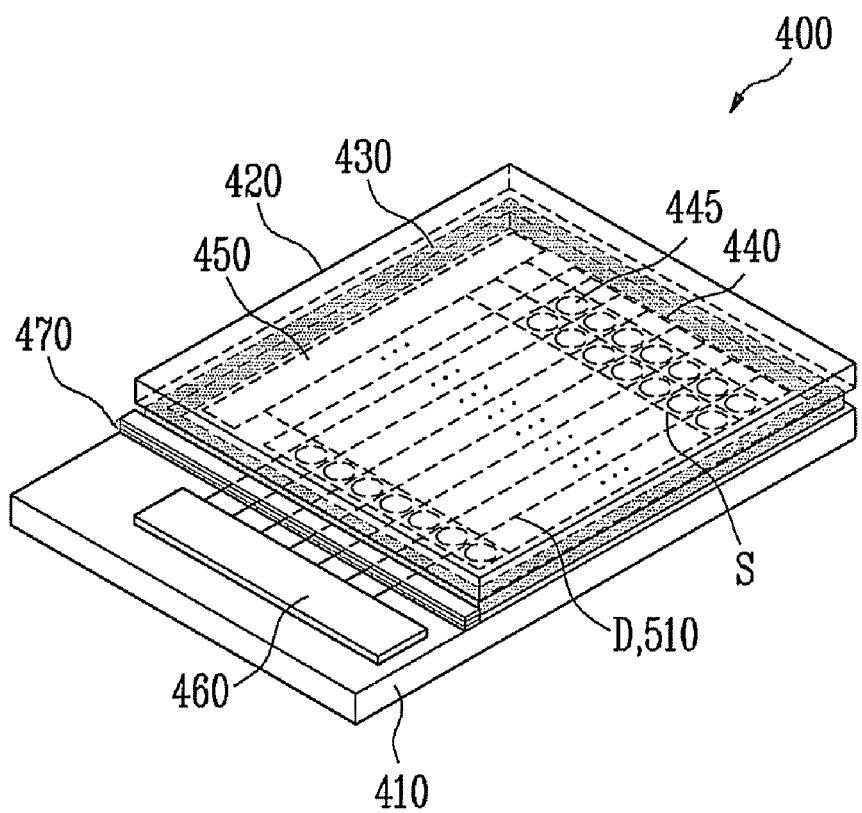
Figure 7:
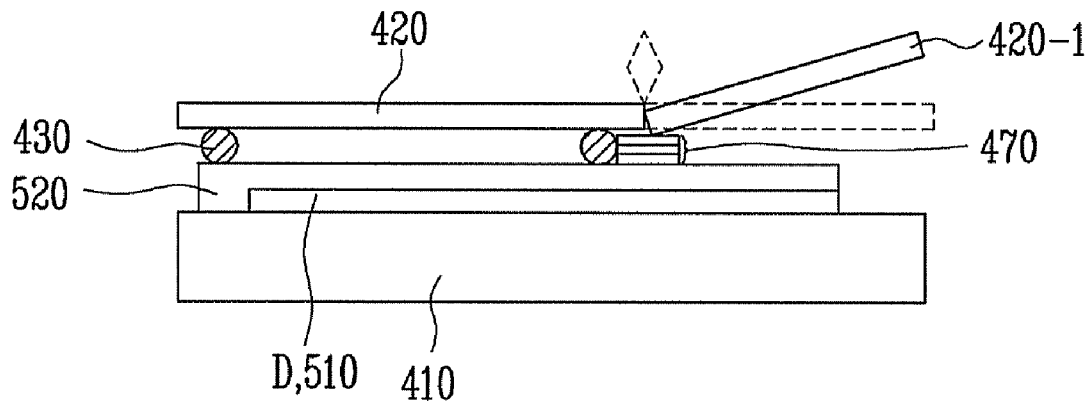
FIG. 7 is a cross-sectional view taken along a line C-C' of FIG. 6D.

Referring to FIGS. 6A to FIG. 7, in order to fabricate the organic light emitting display (OLED) device 400 as shown in FIG. 4, transistors (not shown) of the pixels 445, scan lines (S), data lines (D) and a scan driver 450 are firstly formed on the device substrate 410 in which the pixel region 440 is defined.

Here, if the pixels 445 include at least one transistor (not shown), then the scan lines (S) and the data lines 510 (D) may be formed together with the pixels 445 during the process for forming the pixels 445. And, the scan lines (S) and the data lines 510 (D) may be formed of the same material as the material from which the electrodes of the transistors are formed. If the transistors of the pixels 445 are formed, then at least one inorganic planarization layer (not shown) is formed on the transistors.

At this time, in order to ensure stability of the scan lines (S) and the data lines 510 (D) and to effectively protect them, at least one insulator is generally formed on the scan lines (S) and the data lines 510 (D). And, the insulator is formed together with the pixels 445 using the same insulator materials as those in the pixel region 440, thus increasing the efficiency of the process.

For example, the first protective layer 520, as shown in FIG. 5, may be formed on the data lines 510 (D) with a laminated structure of the same inorganic insulator materials as in the pixel region 440 and formed in the same process as for forming an interlayer insulator and/or an inorganic planarization layer of the pixel region 440 (FIG. 6A).

Then, an organic planarization layer which is composed of acryl, etc., (not shown) and organic light emitting diodes (not shown), are formed on the inorganic planarization layer in the pixel region 440. And, at least one second protective layer 470 is formed in one region of the first protective layer 520 and formed to cross the data lines 510 (D).

Here, the second protective layer 470 is formed inside a scribing tolerance zone to overlap the scribing line on the encapsulation substrate 420. The second protective layer 470 is arranged on the device substrate 410 and arranged to not overlap the sealing agent 430, which is coated on the encapsulation substrate 420. That is to say, the second protective layer 470 is arranged outside the sealing region and the sealing agent 430. At this time, the scribing tolerance zone, which is a region existing within a predetermined distance from the center of the scribing line, is a region which is arranged in a region affected by the scribing. The width of the scribing tolerance zone accounts for an error range associated with the application of the scribing line 610. The scribing tolerance zone is arranged about a region scratched by scribing in the scribing process of the encapsulation substrate 420. For example, the scribing tolerance zone may be set to a region within a range of 300 μm from the scribing line. Or, the scribing tolerance zone may be less than or about 600 μm wide.

The second protective layer 470 is formed together with the pixels 445 in the process for forming the pixels 445 using the same material as at least one organic insulator material disposed in the pixel region 440.

The second protective layer 470 may be formed with at least one laminated structure formed of an organic planarization layer, a pixel definition layer, and an organic spacer of the pixel region 440 and formed during the process for forming the organic planarization layer, the pixel definition layer, and the organic spacer of the pixel region 440. FIG. 6B shows that the second protective layer 470 is formed with a laminated structure of three organic insulators composed of the organic planarization layer, the pixel definition layer, and the organic spacer material. But, the second protective layer 470 is not limited thereto, and the second protective layer 470 may be formed with a single-layered structure and formed of one of the organic insulator materials in the pixel region 440. For example, the second protective layer 470 may be formed only of a single-layered organic insulator composed of the organic planarization layer materials and formed during the process for forming an organic planarization layer of the pixel region 440 (FIG. 6B).

Then, the sealing agent 430 is applied to the encapsulation substrate 420 such that when the encapsulation substrate 420 is affixed to the device substrate 410 the sealing agent 430 is formed about the periphery of the pixel region 440 to form the sealing region. If the scan driver 450 and the data driver 460 are to be disposed in the sealing region, then they are formed on the device substrate 410 in an area to become the sealing region before the encapsulation substrate 420 is affixed to the device substrate 410. The sealing agent 430 is then disposed on the encapsulation substrate 420 so as to seal the scan driver 450 and the data driver in the sealing region. The encapsulation substrate 420, having the sealing agent 430 disposed on a surface to face the device substrate 410, is arranged on the device substrate 410 A sealing process for sealing a region between the device substrate 410 and the encapsulation substrate 420 is then effected using the sealing agent 430. At this time, the sealing agent 430 is applied along an edge of a region inside the scribing line 610 of the encapsulation substrate 420 and used to seal the sealing region, which includes at least the pixel region 440. Also, the sealing agent 430 may be formed on the first protective layer 520 to overlap the first protective layer 520 but arranged to not overlap the second protective layer 470. That is to say, the second protective layer 470 should be arranged outside the sealing region and the sealing agent 430. The sealing process is effected when the sealing agent 430 is formed at a height higher than or the same as that of the second protective layer 470. The scribing line 610 on the encapsulation substrate 420 and the second protective layer 470 are arranged to overlap with each other (FIG. 6C).

Then, the scribing process of the encapsulation substrate 420 is effected and a line is scribed along the scribing line 610 on the encapsulation substrate 420, thereby forming a removal region 420-1. The removal region 420-1 is separated from the encapsulation substrate 420 (FIG. 6D).

Then, a data driver 460 is installed onto an exposed region of the device substrate 410 and connected with the ends of the data lines 510 (D) that extend outside of the sealing region (FIG. 6E).

If the second protective layer 470 is formed in the fabricating process of the OLED device 400, then the second protective layer 470 prevents the removal region 420-1 of the encapsulation substrate 420 from directly colliding with the first protective layer 520 when the removal region 420-1 is removed. And, the first protective layer 520 is also prevented from being broken since the second protective layer 470 relieves the impact of the collision with the removal region 420-1 of the encapsulation substrate 420. Therefore, the first protective layer 520 effectively protects the data lines 510 (D) from the penetration of moisture, etc., thereby preventing damage, such as disconnection of the data lines 510 (D) when the OLED device 400 is used in the reliability test at high temperature and moisture.

FIG. 7 is a cross-section of the OLED device 400 taken along the line C-C' in FIG. 6D and illustrates the protection of the first protective layer 460 as provided by the second protection layer 470. When the removal region 420-1 is removed from the encapsulation substrate 420 and from the OLED device 400, an edge of the removal region 420-1 may contact and pierce the first protective layer 520 but for the protection provided by the second protection layer 470. As a result, the data lines 510 (D), disposed on the device substrate 410, are protected from the scribing process. Also, the sealing agent 430 is disposed between the first protective layer 520 and the encapsulation substrate 420, but the sealing agent 430 does not overlap the second protective layer 470.

Figure 8A:
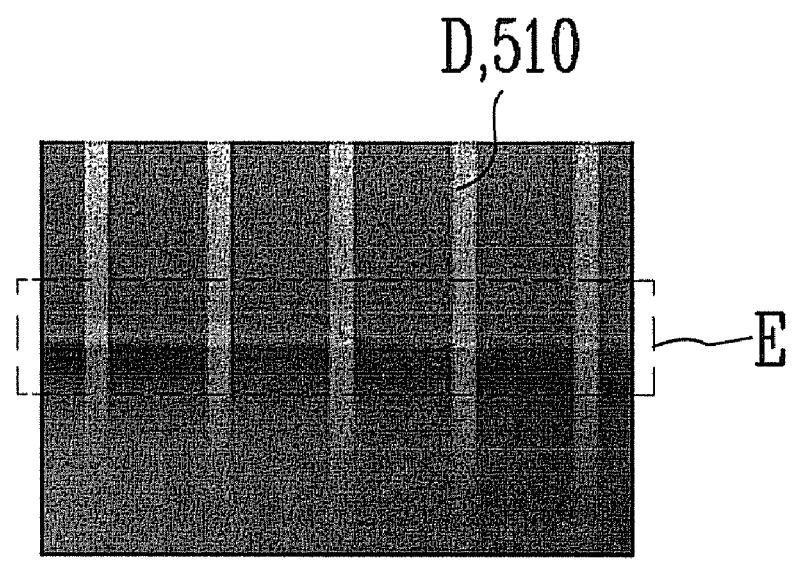
FIG. 8A to FIG. 8B are diagrams showing a result of observing the region "B" of the organic light emitting display device as shown in FIG. 4 after the scribing of the encapsulation substrate is completed.
Figure 8B:
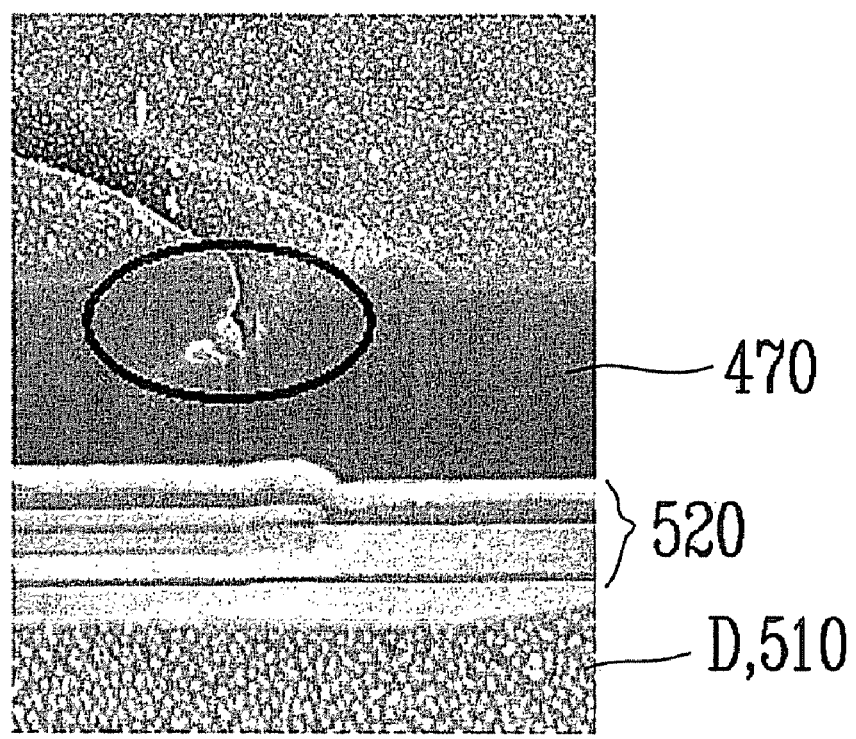

FIGS. 8A and 8B are diagrams showing a result of observing the region "B" of the OLED device 400 as shown in FIG. 4 after the scribing process and a washing process of the encapsulation substrate are completed. The data lines and the first and second protective layer are shown in FIGS. 8A and 8B to the exclusion of other components.

Referring to FIGS. 8A and 8B, a process for removing particles, etc., produced from scribing, or a washing process, is effected generally when the data driver 460 is not installed and after the scribing process is completed. After the washing process, scratches generated during the scribing process in the second protective layer 470 and arranged beneath the scribing line 610 are evident, as shown in a region "E" of FIG. 8A. However, the first protective layer 520 and the data lines 510 (D), which are protected by the second protective layer 470, are not damaged as the first protective layer 520 and the data lines 510 (D) are arranged beneath the second protective layer 470.

More particularly, deep grooves are formed beneath the scribing line 610 in the second protective layer 470. The deep grooves or scratches are generated during the scribing process and the separation process of the removal region 420-1 of the encapsulation substrate 420, as shown in FIG. 8B. FIG. 8B shows a cross-sectional view of the region "E" of FIG. 8A and shows that the first protective layer 520 and the data line (D, 510) arranged beneath the scribing line 610 are not damaged.

Accordingly, the first protective layer 520 effectively protects the data lines 510 (D) from oxygen and moisture and prevents a disconnection of the data lines 510 (D) when a subsequent reliability test is carried out at high temperature and moisture.

Figure 9:
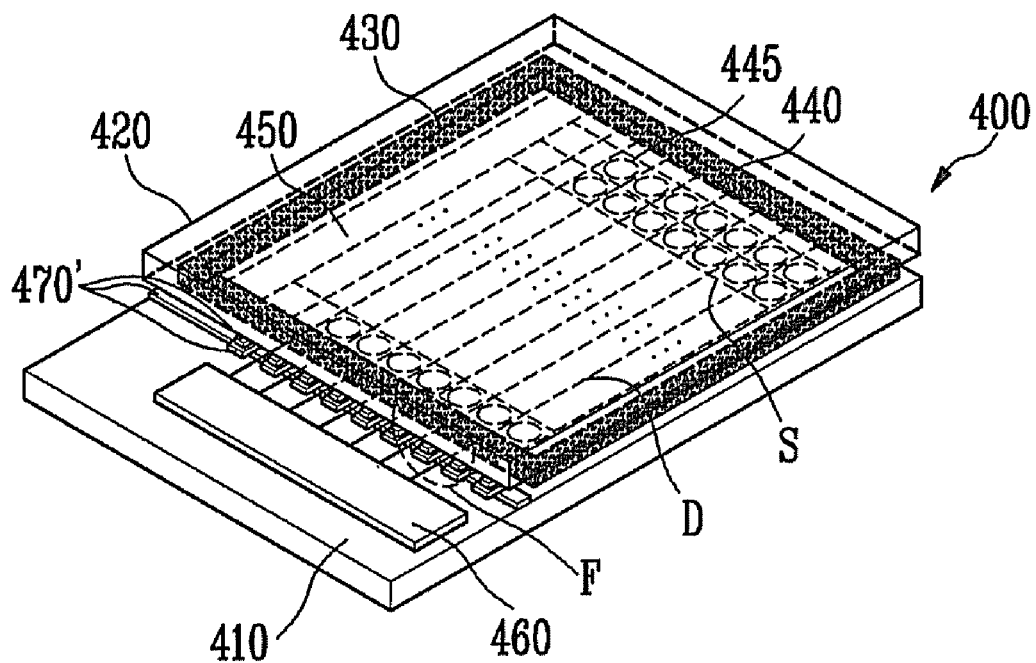
FIG. 9 is a perspective view showing an organic light emitting display device according to another aspect of the present invention.
Figure 10:
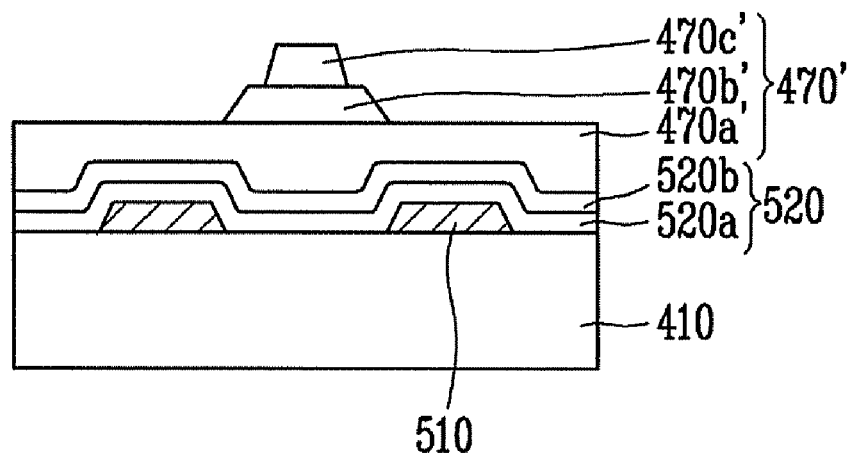
FIG. 10 is a cross-sectional view showing the main part taken along a region "F" of FIG. 9.

Referring to FIGS. 9 and 10, some of the insulators of the second insulator 470' may be arranged between the data lines 510 (D) so as to not overlap the data lines 510 (D).

FIG. 9 is a perspective view showing an organic light emitting display (OLED) device 400 according to other aspects of the present invention. And, FIG. 10 is a cross-sectional view showing a portion taken along a region "F" of FIG. 9. In FIGS. 9 and 10, the same parts have the same reference numerals as in the above descriptions and illustrations and as shown in FIG. 4 and FIG. 5, and their detailed descriptions are omitted herein.

Referring to FIG. 9 and FIG. 10, second and third organic insulators 470b' and 470c' in the second protective layer 470' are arranged between the data lines 510 (D) so as to not overlap the data lines 510 (D). However, the second and third organic insulators 470b' and 470c' prevent direct impacts on the data lines 510 (D) in the scribing process and the separation process of the encapsulation substrate 420.

As described above, according to the OLED device 400 the wires 510 (D) may be protected from the penetration of oxygen and moisture. Thus, defects in the wires, such as disconnection, etc., may be prevented by forming the first protective layer 520, composed of the inorganic insulators, on the wires 510 (D), such as power lines, signal lines, and data lines, etc., formed to extend from the inside of the sealing region to the outside of the sealing region.

As is illustrated, it is not necessary that the second protective layer 470' extend to cross the wires 510 (D). The second protective layer 470' may be formed into structures disposed between the wires 510 (D) while maintaining sufficient protection of the first protective layer 520. The second protective layer 470' dissipates energy exerted thereon without breaching the first protective layer 520. Furthermore, the first organic insulator 470a' may be disposed to cross the wires 510 (D) along the scribing tolerance zone but not to overlap the sealing agent 430 as described above. However, the second and third organic insulators 470b' and 470c' may form structures between the wires 510 (D). Again, the second protective layer 470' is not limited thereto. The first and second organic insulators 470a' and 470b' may be formed to cross the wires 510 (D) in the scribing tolerance zone but not to overlap the sealing agent 430; and, the third organic insulator 470c' may form structures disposed between the wires 510 (D).

Also, the first protective layer 520 may be protected from being broken by external impacts during the scribing process of the encapsulation substrate by forming the second protective layer 470', composed of at least one organic insulator, on the easily broken first protective layer 520. Thus, the first protective layer 520 sufficiently protects the wires 510 (D) from oxygen and moisture. Therefore, the wires 510 (D), such as the data lines, etc., are more effectively protected to prevent disconnection, etc., and poor organic light emitting display device performance.

Also, the second protective layer 470', which is an organic layer, is arranged outside of the sealing agent 430 and the sealing region so as to not overlap the sealing agent 430. Also, the second protective layer 470' may be formed to a lower height than or the same height as the sealing agent. The forming of the second protective layer 470' to such heights improves the sealing properties of the sealing agent 430 and the sealing process. Accordingly, oxygen and moisture are prevented from penetrating into the sealing region and corroding the wires 510 (D).

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device, comprising:
a device substrate including at least a pixel region;
an encapsulation substrate arranged to overlap at least one region of the device substrate including the pixel region;
a sealing agent arranged between the device substrate and the encapsulation substrate to seal a sealing region between the device substrate and the encapsulation substrate;
at least one wire formed on the device substrate so that a first end of the at least one wire is arranged inside the sealing region which is sealed by the sealing agent and a second end of the at least one wire is arranged outside of the sealing region;
a first protective layer disposed on the device substrate to cover the at least one wire; and
a second protective layer disposed on the first protective layer only in a scribing tolerance zone of the encapsulation substrate outside of the sealing region, the scribing tolerance zone overlapping at least one edge of the encapsulation substrate which is arranged to cross the at least one wire, wherein:
the second protective layer is formed with a laminated structure of at least two organic insulators, and
at least one of the organic insulators in the second protective layer is formed in a region that crosses the at least one wire but the at least one of the organic insulators does not overlap the at least one wire.

2. The organic light emitting display device according to claim 1, wherein the first protective layer is formed of at least one inorganic layer, and the second protective layer is formed of at least one organic layer.

3. The organic light emitting display device according to claim 1, wherein the first protective layer is formed of at least one inorganic insulator selected from the group consisting of insulators disposed in the pixel region.

4. The organic light emitting display device according to claim 1, wherein the first protective layer is formed of at least one layer selected from the group consisting of an interlayer insulator of the pixel region and an inorganic planarization layer of the pixel region.

5. The organic light emitting display device according to claim 1, wherein the second protective layer is formed of at least one organic insulator selected from the group consisting of insulators disposed in the pixel region.

6. The organic light emitting display device according to claim 1, wherein the second protective layer is formed of same materials as at least one structure selected from the group consisting of an organic planarization layer, a pixel definition layer, and spacers disposed between pixels of the pixel region.

7. The organic light emitting display device according to claim 1, wherein the second protective layer is formed with a laminated structure of at least two insulators selected from the group consisting of an organic planarization layer, a pixel definition layer, and spacers disposed between pixels of the pixel region.

8. The organic light emitting display device according to claim 1, wherein the second protective layer includes at least one material selected from the group consisting of acryl and polyimide.

9. The organic light emitting display device according to claim 1, wherein the second protective layer is formed to not overlap the sealing agent.

10. The organic light emitting display device according to claim 1, wherein the second protective layer is formed to a lower height than or a same height as the sealing agent.

11. The organic light emitting display device according to claim 1, wherein the scribing tolerance zone of the encapsulation substrate is within about 300 μm of the at least one edge of the encapsulation substrate.

12. The organic light emitting display device according to claim 1, wherein a data driver for supplying data signals to the pixel region is installed on the device substrate outside the sealing region, and the at least one wire is a plurality of data lines formed between the pixel region and the data driver.

13. The organic light emitting display device according to claim 1, wherein the at least one wire is a plurality of data lines.

14. The organic light emitting display device according to claim 12, wherein the second protective layer is formed between the sealing agent and the data driver.

15. An organic light emitting display device, comprising:
a device substrate;
an encapsulation substrate disposed to face the device substrate;
pixels formed on the device substrate;
supply units to apply electrical signals to the pixels;
at least one wire formed on the device substrate to connect the pixels to the supply units;
a first protective layer formed on the device substrate to cover the pixels and the at least one wire;
a sealing agent that seals a sealing region between the encapsulation substrate and the first protective layer disposed on the device substrate; and
a second protective layer formed on the first protective layer in a scribing tolerance zone of the encapsulation substrate outside of the sealing region,
wherein at least one of the supply units is disposed outside of the sealing region, and the scribing tolerance zone is disposed to cross the at least one wire between the sealing agent and the at least one of the supply units disposed outside of the sealing region, and
wherein the second protective layer is disposed inside the scribing tolerance zone but does not cover the at least one wire.

16. The organic light emitting display device of claim 15, wherein the first protective layer further comprises:
a plurality of layers of inorganic insulators.

17. The organic light emitting display device of claim 15, wherein the second protective layer further comprises:
a plurality of layers of organic insulators.

18. The organic light emitting display device of claim 15, wherein the second protective layer is disposed inside the entire scribing tolerance zone.

19. The organic light emitting display device of claim 17, wherein the plurality of layers of organic insulators further comprises:
a first portion of the plurality of layers of organic insulators disposed inside the entire scribing tolerance zone; and
a second portion of the plurality of layers of organic insulators disposed on the first portion of the plurality of layers of organic insulators but not to overlap the at least one wire.

20. The organic light emitting display device of claim 15, wherein the scribing tolerance zone is less than or about 600 μm wide.

21. The organic light emitting display device of claim 15, wherein at least one edge of the encapsulation substrate is formed by scribing and extends beyond the sealing agent into the scribing tolerance zone.

22. The organic light emitting display device of claim 15, wherein at least one edge of the encapsulation substrate is formed by scribing and extends about 300 μm into the scribing tolerance zone.

23. The organic light emitting display device of claim 15, wherein the at least one of the supply units disposed outside of the sealing region is at least one of a pad unit, a data control unit, a data driver, a scan control unit, a scan driver, and a power supply.

24. The organic light emitting display device of claim 15, further comprising a plural number of scribing tolerance zones disposed to cross the at least one wire between the sealing agent and the at least one of the supply units disposed outside of the sealing region.

25. The organic light emitting display device of claim 15, further comprising:
a data driver formed inside the sealing region; and
a scan driver formed inside the sealing region,
wherein the at least one of the supply units disposed outside of the sealing region is a power supply, and the at least one wire is a power supply wire.

26. The organic light emitting display device of claim 25, further comprising:
a data control unit formed inside the sealing region; and
a scan control unit formed inside the sealing region.

27. The organic light emitting display device of claim 15, further comprising:
a data driver formed inside the sealing region; and
a scan driver formed inside the sealing region,
wherein the at least one of the supply units disposed outside of the sealing region is a pad unit that supplies data control signals to the data driver, and the pad unit supplies scan control signals to the scan driver, and the at least one wire is a plurality of data control lines and a plurality of scan control lines.

* * * * *